United States Patent
Chin et al.

(10) Patent No.: US 11,307,785 B2
(45) Date of Patent: Apr. 19, 2022

(54) SYSTEM AND METHOD FOR DETERMINING AVAILABLE POST-PACKAGE REPAIR RESOURCES

(71) Applicant: DELL PRODUCTS, LP, Round Rock, TX (US)

(72) Inventors: Jordan Chin, Austin, TX (US); Rene Franco, Round Rock, TX (US)

(73) Assignee: Dell Products L.P., Roun, TX (US)

( * ) Notice: Subject to any disclaimer, the term of this patent is extended or adjusted under 35 U.S.C. 154(b) by 73 days.

(21) Appl. No.: 16/801,547

(22) Filed: Feb. 26, 2020

(65) Prior Publication Data
US 2021/0263646 A1 Aug. 26, 2021

(51) Int. Cl.
G06F 3/06 (2006.01)

(52) U.S. Cl.
CPC .......... *G06F 3/064* (2013.01); *G06F 3/0604* (2013.01); *G06F 3/0673* (2013.01)

(58) Field of Classification Search
CPC ...... G06F 3/064; G06F 3/0673; G06F 3/0604; G11C 29/76; G11C 29/4401; G11C 29/10; G11C 29/24; G11C 29/44; G11C 2029/4402
See application file for complete search history.

(56) References Cited

U.S. PATENT DOCUMENTS

| | | | |
|---|---|---|---|
| 6,704,228 B2 | 3/2004 | Jang et al. | |
| 10,546,649 B2 | 1/2020 | Pope et al. | |
| 2015/0135038 A1* | 5/2015 | Wilson | G11C 29/76 714/773 |
| 2015/0287480 A1* | 10/2015 | Wilson | G11C 17/16 365/96 |
| 2016/0300627 A1* | 10/2016 | You | G11C 29/76 |
| 2016/0307647 A1* | 10/2016 | Morgan | G11C 29/787 |
| 2017/0098480 A1* | 4/2017 | Wilson | G11C 17/18 |
| 2017/0200511 A1* | 7/2017 | Warnes | G11C 29/44 |
| 2017/0308447 A1* | 10/2017 | Wu | G11C 29/835 |
| 2018/0204631 A1* | 7/2018 | Warnes | G11C 29/70 |
| 2018/0247699 A1* | 8/2018 | Pope | G11C 29/10 |
| 2019/0333601 A1* | 10/2019 | Wilson | G11C 29/70 |
| 2020/0117558 A1* | 4/2020 | Wilson | G06F 11/0751 |
| 2020/0151070 A1* | 5/2020 | Lee | G11C 11/4091 |

* cited by examiner

*Primary Examiner* — Francisco A Grullon
(74) *Attorney, Agent, or Firm* — Larson Newman, LLP

(57) ABSTRACT

A dual in-line memory module (DIMM) includes a memory storage device having data rows and redundant rows. The DIMM further includes a post-package repair module configured to remap an address within the DIMM physical address space from a data row to a redundant row. A memory controller is configured to determine an exact number of un-remapped redundant rows.

13 Claims, 3 Drawing Sheets

SYSTEM AND METHOD FOR DETERMINING AVAILABLE POST-PACKAGE REPAIR RESOURCES

FIELD OF THE DISCLOSURE

This disclosure generally relates to information handling systems, and more particularly relates to determining available post-package repair resources in an information handling system.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

A dual in-line memory module (DIMM) includes a memory storage device having data rows and redundant rows. The DIMM further includes a post-package repair module configured to remap an address within the DIMM physical address space from a data row to a redundant row. A memory controller may be configured to determine an exact number of un-remapped redundant rows.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which.

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings. However, other teachings can certainly be used in this application. The teachings can also be used in other applications, and with several different types of architectures, such as distributed computing architectures, client/server architectures, or middleware server architectures and associated resources.

Figure 1:
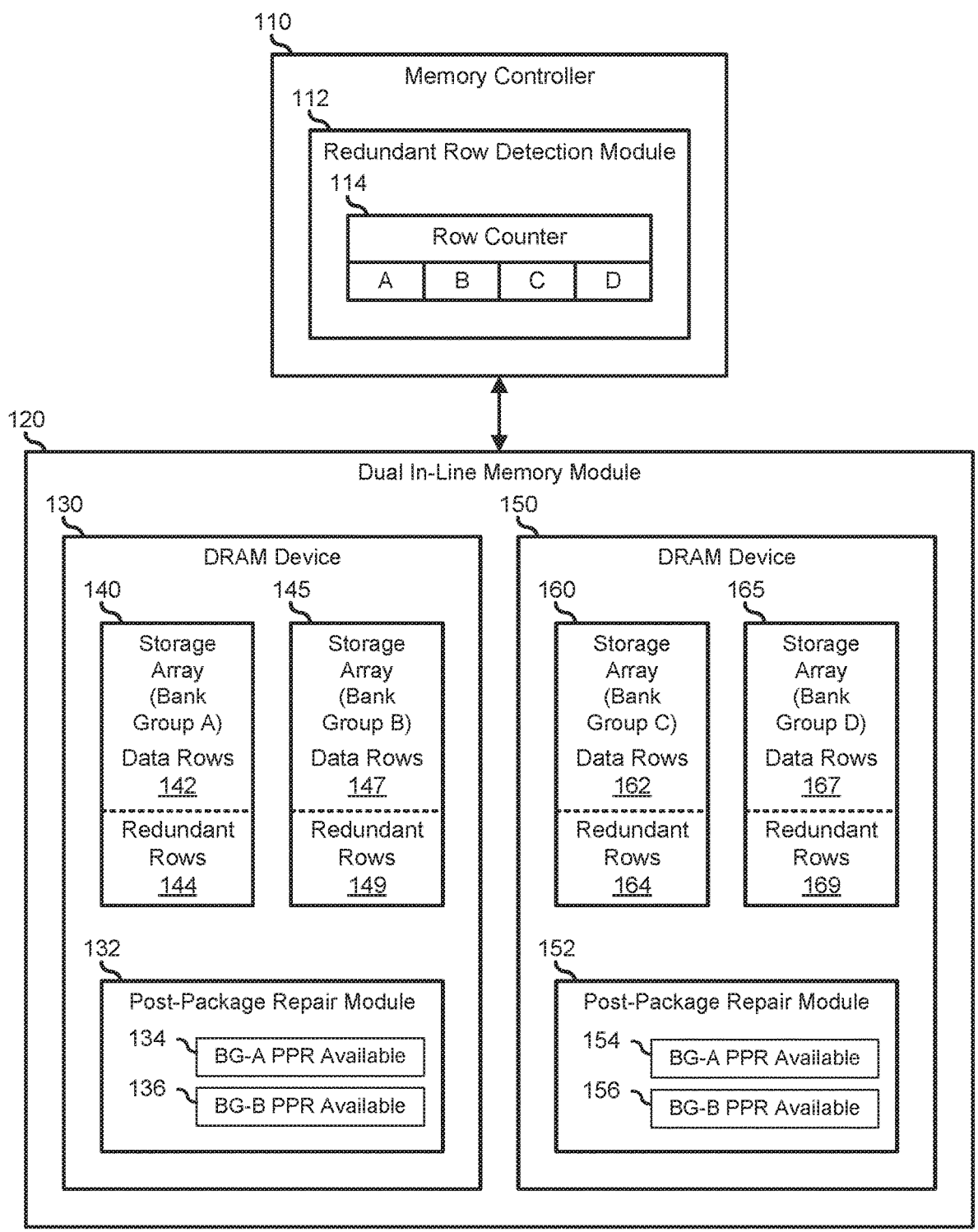
FIG. 1 is a block diagram illustrating an information handling system according to an embodiment of the present disclosure.

FIG. 1 illustrates an information handling system 100, including a memory controller 110 and a dual in-line memory module 120. Information handling system 100 represents hardware, firmware, and software components that are typically associated with a computer or other information handling system. Memory controller 110 and DIMM 120 are coupled together via a memory channel. Hereinafter, memory controller 110 and DIMM 120 may be referred to as the memory subsystem. Memory controller 110 represents a portion of information handling system 100 that operates to manage the flow of information to the main memory of the information handling system, represented by DIMM 120. Memory controller 110 and DIMM 120 operate in accordance with a particular memory architecture implemented on information handling system 100. For example, memory controller 110 and DIMM 120 may operate in accordance with a Double-Data Rate (DDR) standard, such as a JEDEC DDR4 or DDR5 standard. Memory controller 110 includes a redundant row detection module 112, described further below. It will be understood that, where memory controller 110 and DIMM 120 operate in accordance with the DDR5 standard, then the memory controller and DIMM will be configured to provide two separate memory channels0. Note that, as illustrated, post-package module 112 is shown as a part of memory controller 110, but this is not necessarily so, and the functions and features of a redundant row detection module as described herein can be performed by other elements of an information handling system, such as by a system BIOS, a baseboard management controller, an error or interrupt handler, or the like.

DIMM 120 includes a dynamic random access memory (DRAM) device 130, a DRAM device 150, and one or more additional DRAM devices. DRAM device 130 includes a post-package repair (PPR) module 132 and storage arrays 140 and 145. Storage array 140 provides data storage cells associated with a first bank group (bank group A) of the DIMM physical address space of DIMM 120, and storage array 145 provides data storage cells associated with a second bank group (bank group B) of the DIMM physical address space. Storage array 140 organizes the data storage cells into rows that store contiguous byte-addressable data, and includes data rows 142 that store active data for information handling system 100, and redundant rows 144 that are available for remapping purposes when rows within data rows 142 fail, as described further, below. Similarly, storage array 144 organizes the data storage cells into rows that store contiguous byte-addressable data, and includes data rows 147 that store active data for information handling system 100, and redundant rows 149 that are available for remapping purposes when rows within data rows 147 fail. It will be understood that a typical DRAM may include one or more storage arrays that provide data storage cells associated with additional bank groups of the DIMM physical address space, as needed or desired. PPR module 132 provides logic and circuitry to permit the remapping of redundant rows 144 and 149 into the selected failing rows of respective data rows 142 and 147, as described further below. PPR module 132 includes flag bit locations 134 and 136 within a control register of the PPR module that indicate whether or not any redundant rows are available for PPR operations. In particular, flag bit location 134 indicates that redundant rows 144 includes zero redundant rows or includes one or more redundant rows, and flag bit location 136 indicates that redundant rows 149 includes zero redundant rows or includes one or more redundant rows.

DRAM device 150 includes a PPR module 152 and storage arrays 160 and 165. Storage array 160 provides data storage cells associated with a third bank group (bank group C) of the DIMM physical address space of DIMM 120, and storage array 165 provides data storage cells associated with a fourth bank group (bank group D) of the DIMM physical address space. Storage array 160 organizes the data storage cells into rows that store contiguous byte-addressable data, and includes data rows 162 that store active data for information handling system 100, and redundant rows 164 that are available for remapping purposes when rows within data rows 162 fail, as described further, below. Similarly, storage array 164 organizes the data storage cells into rows that store contiguous byte-addressable data, and includes data rows 167 that store active data for information handling system 100, and redundant rows 169 that are available for remapping purposes when rows within data rows 167 fail. PPR module 152 provides logic and circuitry to permit the remapping of redundant rows 164 and 169 into the selected failing rows of respective data rows 162 and 167, as described further below. PPR module 152 includes flag bit locations 154 and 156 within a control register of the PPR module that indicate whether or not any redundant rows are available for PPR operations. In particular, flag bit location 154 indicates that redundant rows 164 includes zero redundant rows or includes one or more redundant rows, and flag bit location 156 indicates that redundant rows 169 includes zero redundant rows or includes one or more redundant rows.

PPR modules 132 and 152 operate to detect row errors in respective data rows 142, 147, 162, and 167, to determine an available row within respective redundant rows 144, 149, 164, and 169, and to map memory transactions directed to the failing row to a selected redundant row. Here, a manufacturer of DRAM devices may provide a number or redundant rows associated with each bank group on the DRAM device, and, during manufacturing testing, remap the redundant rows to identified failing rows. In this way, a manufacturer of DRAM devices obtains a higher yield on the fabrication of the DRAM devices. Further, an original equipment manufacturer (OEM) may initiate a PPR process in response to memory errors detected during the operation of the DIMMs in an information handling system. Here, redundant row detection module 112 operates to receive an indication of correctable or uncorrectable errors on a particular row within one of storage arrays 140, 145, 160, and 165. For example, redundant row detection module 112 may receive an alert that an error was detected by one of DRAM devices 130 and 140. Redundant row detection module 112 then determines if any redundant rows are available on the bank group associated with the error. For example, redundant row detection module 112 can query flag bit locations 134, 136, 154, or 156 to determine if the bank group associated with the error has any available redundant rows. If so, redundant row detection module 112 can direct the appropriate one of PPR modules 132 or 152 to map memory transactions directed to the failing row to a selected redundant row. Here, the PPR operation can be a hard PPR or a soft PPR. In a hard PPR, the remapping of the redundant row into the memory map is made permanent by a process that fuses the remapping. In a soft PPR, the remapping of the redundant row in the memory map is temporary, only persisting while power is maintained to DIMM 120. After a power cycle, such as during a reboot, any mappings of redundant rows 144, 149, 164, or 169 into respective data rows 142, 147, 162, or 167 that are not fused are lost. It will be understood that the use of a hard PPR, as opposed to a soft PPR, may be desirable when an end user desires to ensure that the remappings performed on a DRAM device are transferred with the DIMM when the DIMM is removed from an initial information handlings system and is placed into a new information handling system, such that the new information handling system does not need to rediscover the row failures that caused the remappings.

The number of redundant rows that are available on a DRAM device is not typically known as such information may reveal confidential information of the DRAM device manufacturer's processes. Moreover, the remappings to redundant rows are typically fused into the DRAM devices by the DRAM device manufacturer, so that the remappings are not typically visible to an original equipment manufacturer (OEM) who is the end user of the DRAM devices, as packaged into DIMMs. As such, after the manufacturing process, the number of redundant rows in any particular bank group is unknown to the OEM, not only because the original number of redundant rows on a DRAM device is held confidential, but also because the number of redundant rows utilized in the manufacturing process is not detectable.

To partially compensate the OEM for the lack of specificity in determining the number of redundant rows that are available in a particular bank group, flag bit locations 134, 136, 154, and 156 are provided in some DRAM devices to indicate the presence or absence of available redundant rows. However, as noted above, flag bit locations 134, 136, 154, and 156 only indicate that no redundant rows are available, or that at least one redundant row is available, but do not indicate a total number or redundant rows. Moreover, various DDR specifications, such as the DDR4 specification and the DDR5 specification, only require that DRAM devices have one redundant row available to the OEM after the manufacturing process. Further, as the storage capacity of DRAM devices has increased, the number of expected failures detected during the manufacturing process is increasing, and so the number of redundant rows associated with each bank group is likewise increasing and the pool of available redundant rows after the manufacturing process is increasing as well.

On the other hand, it may be advantageous to have a clearer picture as to the number of available redundant rows for each bank group. For example, information handling system 100 may provide an intelligent rationing system for the available redundant rows. Here, when a large number of redundant rows are available, information handling system 100 can liberally apply the repair process at the first sign of correctable errors occurring. Then, as the number of available redundant rows diminishes, the intelligent rationing system can behave more conservatively in applying those resources. However, instituting an intelligent rationing system requires knowing the number redundant row that are available for each bank group.

In a particular embodiment, redundant row detection module 112 operates to determine the number of redundant rows in redundant rows 144, 149, 164, and 169 after the PPR operations have been performed during the manufacturing process. In particular, during a process that may be separate from run time memory operations, such as during a system boot process for information handling system 100, redundant row detection module 112 performs memory operations that result in a definite determination of the numbers and locations of the redundant rows. Here, redundant row detection module 112 operates to direct memory controller 110 to write a known pattern into all rows of a particular bank, and then directs the associated PPR modules 132 and 152 to perform a soft PPR on a selected row in the bank. Then redundant row detection module 112 directs memory controller 112 to read back the contents of the selected row, and the redundant row detection module determines if the contents of the selected row are different than the known pattern. If the contents of the selected row are different than the known pattern, then the PPR operation performed by PPR modules 132 and 152 was successful. This is because the write of the known pattern into all rows will not result in the known pattern being written into the redundant rows. Instead, the redundant rows will have different contents, such as a default value of all zeros or all ones. Because the PPR operation performed by PPR modules 132 and 152 was successful, redundant row detection module 112 determines that there is at least one redundant row in each bank group that had the successful PPR operation, and the redundant row detection module increments row counters 114 associated with each bank group that had the successful PPR operation.

After a successful PPR operation and the incrementing of row counters 114, redundant row detection module 112 directs memory controller 110 to write a pattern associated with there being one detected row into the selected row (hereinafter the "row count pattern"). For example, redundant row detection module 112 can direct memory controller 110 to write '00000001' to the selected row. Redundant row detection module 112 then repeats the procedure to determine if there are additional redundant rows. On subsequent iterations, after directing memory controller 110 to read back the contents of the selected row, redundant row detection module 112 determines if the contents of the newly selected row are different than the known initial pattern and also if the contents are different than any previously used row count patterns. If the contents of the selected row are different than the known pattern, and also are different than any previously used row count pattern, then the PPR operation performed by PPR modules 132 and 152 was successful, and an additional redundant row is identified, and redundant row detection module 112 increments row counters 114 associated with each bank group that had the successful PPR operation. On the other hand, if no additional redundant rows are available, a particular DRAM device may either ignore the request to perform the soft PPR operation, resulting in the know pattern being read back from the selected row, or the DRAM device may perform the soft PPR operation by remapping a previously used redundant row, resulting in a previously used row count pattern being read back from the selected row. Thus, if either the known pattern or a previously used row count pattern is read back from the selected row, then redundant row detection module 112 determines that there are not additional redundant rows on that particular bank group. When all iterations of the search operation result in no further redundant rows being identified, the search operation is halted, and the number of redundant rows in each bank group is equal to the row counter value for the associated bank group.

Figure 2:
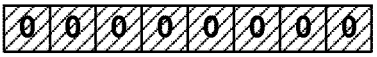
FIG. 2 illustrates a method for determining available post-package repair (PPR) resources in an information handling system in accordance with an embodiment of the present disclosure.
Figure 2:
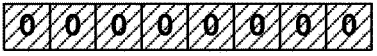
Figure 2:

FIG. 2 illustrates a method for determining available PPR resources in an information handling system. In the illustrated method, a memory with four 8-bit data rows and two spare rows is shown. A known pattern is written into the four rows, as shown in memory state 200. Here, each of the four rows is written with the data pattern '1010101010,' and the spare rows are show with the default pattern '00000000.'A first row, row 0, is selected, and a soft PPR operation is performed on the selected row. As a result, row 0 is remapped to spare 0, as shown in memory state 202. Memory state 202 further shows that the contents of row 0 are read, and the contents (i.e., '00000000') are determined to be different than the known pattern (i.e., '10101010'), and so one spare row is identified, and the spare counter is incremented to "1." Memory state 204 shows where a pattern associated with there being a first spare row (e.g., '00000001') is written into row 0/spare 0.

A next row, row 1, is selected, and a soft PPR operation is performed on the selected row. As a result, row 1 is remapped to spare 1, as shown in memory state 206. Memory state 206 further shows that the contents of row 1 are read, and the contents (i.e., '00000000') are determined to be different than the known pattern (i.e., '10101010'), and are also determined to be different than any previously used pattern associated with a spare row (i.e., 00000001'), and so new one spare row is identified, and the spare counter is incremented to "2." Memory state 208 shows where a pattern associated with there being a second spare row (e.g., '00000010) is written into row 1/spare 1.

A final row, row 2, is selected, and a soft PPR operation is performed on the selected row. As a result, row 2 is remapped to spare 1, as shown in memory state 210. That is, because there are no more spare rows, the last spare row, spare 1, is remapped a second time for row 2. Here, memory state 210 shows that the contents of row 2 are read, and the contents (i.e., '00000010') are determined to be different from the known pattern (i.e., '10101010'), but are also determined to be the same as a previously used pattern associated with a spare row (i.e., '00000010'). As such, over-mapping onto previously identified spare rows has begun, and so a new spare row is not identified, and the spare counter is remains at "2." The method ends here, having identified that the memory includes two spare rows.

Figure 3:
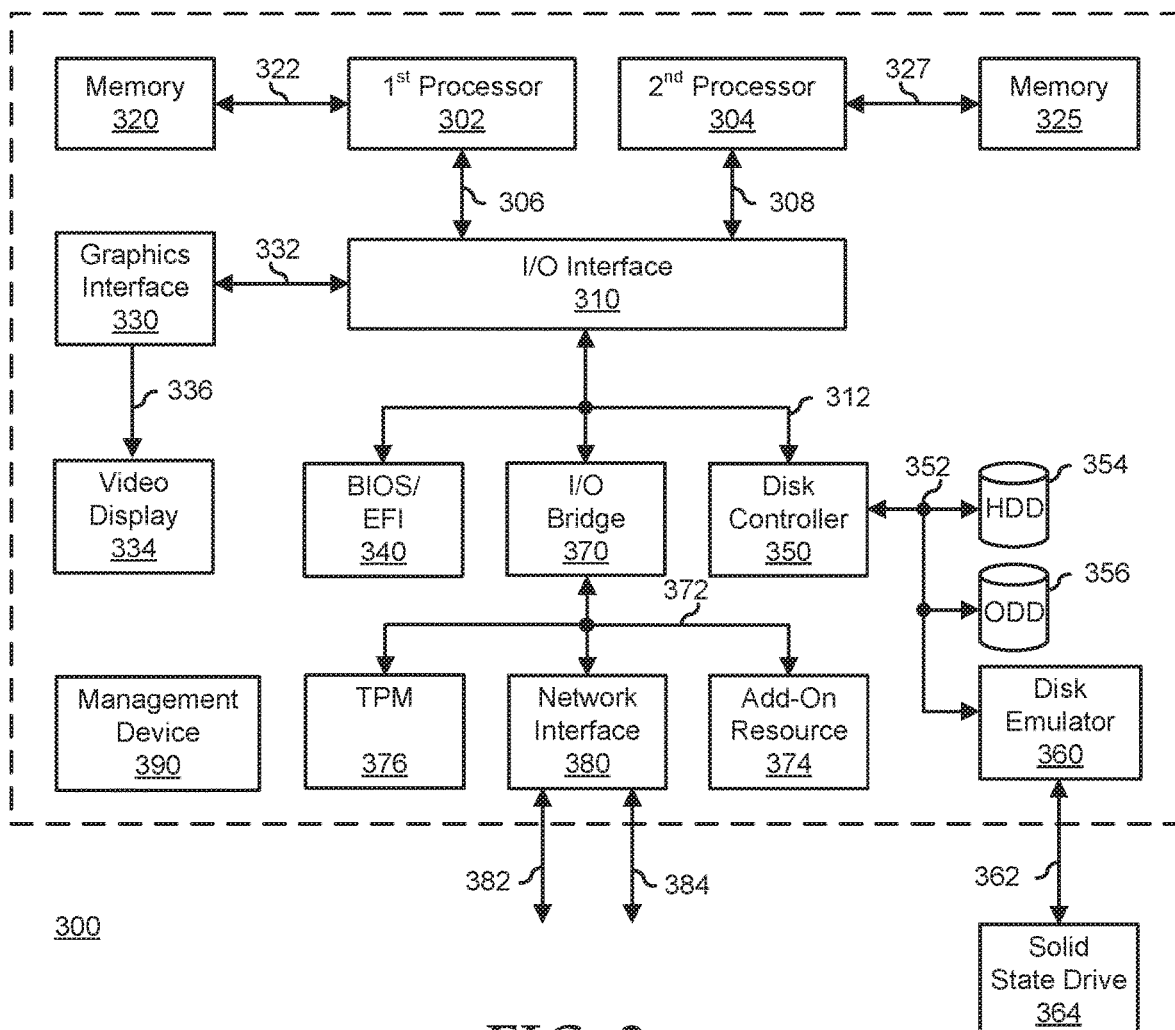
FIG. 3 is a block diagram illustrating an information handling system according to another embodiment of the present disclosure.

FIG. 3 illustrates a generalized embodiment of an information handling system 300 similar to information handling system 100. For purpose of this disclosure an information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, information handling system 300 can be a personal computer, a laptop computer, a smart phone, a tablet device or other consumer electronic device, a network server, a network storage device, a switch router or other network communication device, or any other suitable device and may vary in size, shape, performance, functionality, and price. Further, information handling system 300 can include processing resources for executing machine-executable code, such as a central processing unit (CPU), a programmable logic array (PLA), an embedded device such as a System-on-a-Chip (SoC), or other control logic hardware.

Information handling system 300 can also include one or more computer-readable medium for storing machine-executable code, such as software or data. Additional components of information handling system 300 can include one or more storage devices that can store machine-executable code, one or more communications ports for communicating with external devices, and various input and output (I/O) devices, such as a keyboard, a mouse, and a video display. Information handling system 300 can also include one or more buses operable to transmit information between the various hardware components.

Information handling system 300 can include devices or modules that embody one or more of the devices or modules described below, and operates to perform one or more of the methods described below. Information handling system 300 includes a processors 302 and 304, an input/output (I/O) interface 310, memories 320 and 325, a graphics interface 330, a basic input and output system/universal extensible firmware interface (BIOS/UEFI) module 340, a disk controller 350, a hard disk drive (HDD) 354, an optical disk drive (ODD) 356, a disk emulator 360 connected to an external solid state drive (SSD) 362, an I/O bridge 370, one or more add-on resources 374, a trusted platform module (TPM) 376, a network interface 380, a management device 390, and a power supply 395. Processors 302 and 304, I/O interface 310, memory 320, graphics interface 330, BIOS/UEFI module 340, disk controller 350, HDD 354, ODD 356, disk emulator 360, SSD 362, I/O bridge 370, add-on resources 374, TPM 376, and network interface 380 operate together to provide a host environment of information handling system 300 that operates to provide the data processing functionality of the information handling system. The host environment operates to execute machine-executable code, including platform BIOS/UEFI code, device firmware, operating system code, applications, programs, and the like, to perform the data processing tasks associated with information handling system 300.

In the host environment, processor 302 is connected to I/O interface 310 via processor interface 306, and processor 304 is connected to the I/O interface via processor interface 308. Memory 320 is connected to processor 302 via a memory interface 322. Memory 325 is connected to processor 304 via a memory interface 327. Graphics interface 330 is connected to I/O interface 310 via a graphics interface 332, and provides a video display output 336 to a video display 334. In a particular embodiment, information handling system 300 includes separate memories that are dedicated to each of processors 302 and 304 via separate memory interfaces. An example of memories 320 and 330 include random access memory (RAM) such as static RAM (SRAM), dynamic RAM (DRAM), non-volatile RAM (NV-RAM), or the like, read only memory (ROM), another type of memory, or a combination thereof.

BIOS/UEFI module 340, disk controller 350, and I/O bridge 370 are connected to I/O interface 310 via an I/O channel 312. An example of I/O channel 312 includes a Peripheral Component Interconnect (PCI) interface, a PCI-Extended (PCI-X) interface, a high speed PCI-Express (PCIe) interface, another industry standard or proprietary communication interface, or a combination thereof. I/O interface 310 can also include one or more other I/O interfaces, including an Industry Standard Architecture (ISA) interface, a Small Computer Serial Interface (SCSI) interface, an Inter-Integrated Circuit (I²C) interface, a System Packet Interface (SPI), a Universal Serial Bus (USB), another interface, or a combination thereof. BIOS/UEFI module 340 includes BIOS/UEFI code operable to detect resources within information handling system 300, to provide drivers for the resources, initialize the resources, and access the resources. BIOS/UEFI module 340 includes code that operates to detect resources within information handling system 300, to provide drivers for the resources, to initialize the resources, and to access the resources.

Disk controller 350 includes a disk interface 352 that connects the disk controller to HDD 354, to ODD 356, and to disk emulator 360. An example of disk interface 352 includes an Integrated Drive Electronics (IDE) interface, an Advanced Technology Attachment (ATA) such as a parallel ATA (PATA) interface or a serial ATA (SATA) interface, a SCSI interface, a USB interface, a proprietary interface, or a combination thereof. Disk emulator 360 permits SSD 364 to be connected to information handling system 300 via an external interface 362. An example of external interface 362 includes a USB interface, an IEEE 1394 (Firewire) interface, a proprietary interface, or a combination thereof. Alternatively, solid-state drive 364 can be disposed within information handling system 300.

I/O bridge 370 includes a peripheral interface 372 that connects the I/O bridge to add-on resource 374, to TPM 376, and to network interface 380. Peripheral interface 372 can be the same type of interface as I/O channel 312, or can be a different type of interface. As such, I/O bridge 370 extends the capacity of I/O channel 312 when peripheral interface 372 and the I/O channel are of the same type, and the I/O bridge translates information from a format suitable to the I/O channel to a format suitable to the peripheral channel 372 when they are of a different type. Add-on resource 374 can include a data storage system, an additional graphics interface, a network interface card (NIC), a sound/video processing card, another add-on resource, or a combination thereof. Add-on resource 374 can be on a main circuit board, on separate circuit board or add-in card disposed within information handling system 300, a device that is external to the information handling system, or a combination thereof.

Network interface 380 represents a NIC disposed within information handling system 300, on a main circuit board of the information handling system, integrated onto another component such as I/O interface 310, in another suitable location, or a combination thereof. Network interface device 380 includes network channels 382 and 384 that provide interfaces to devices that are external to information handling system 300. In a particular embodiment, network channels 382 and 384 are of a different type than peripheral channel 372 and network interface 380 translates information from a format suitable to the peripheral channel to a format suitable to external devices. An example of network channels 382 and 384 includes InfiniBand channels, Fibre Channel channels, Gigabit Ethernet channels, proprietary channel architectures, or a combination thereof. Network channels 382 and 384 can be connected to external network resources (not illustrated). The network resource can include another information handling system, a data storage system, another network, a grid management system, another suitable resource, or a combination thereof.

Management device 390 represents one or more processing devices, such as a dedicated baseboard management controller (BMC) System-on-a-Chip (SoC) device, one or more associated memory devices, one or more network interface devices, a complex programmable logic device (CPLD), and the like, that operate together to provide the management environment for information handling system 300. In particular, management device 390 is connected to various components of the host environment via various internal communication interfaces, such as a Low Pin Count (LPC) interface, an Inter-Integrated-Circuit (I2C) interface, a PCIe interface, or the like, to provide an out-of-band (OOB) mechanism to retrieve information related to the operation of the host environment, to provide BIOS/UEFI or system firmware updates, to manage non-processing components of information handling system 300, such as system cooling fans and power supplies. Management device 390 can include a network connection to an external management system, and the management device can communicate with the management system to report status information for information handling system 300, to receive BIOS/UEFI or system firmware updates, or to perform other task for managing and controlling the operation of information handling system 300. Management device 390 can operate off of a separate power plane from the components of the host environment so that the management device receives power to manage information handling system 300 when the information handling system is otherwise shut down. An example of management device 390 include a commercially available BMC product or other device that operates in accordance with an Intelligent Platform Management Initiative (IPMI) specification, a Web Services Management (WSMan) interface, a Redfish Application Programming Interface (API), another Distributed Management Task Force (DMTF), or other management standard, and can include an Integrated Dell Remote Access Controller (iDRAC), an Embedded Controller (EC), or the like. Management device 390 may further include associated memory devices, logic devices, security devices, or the like, as needed or desired.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
   a dual in-line memory module (DIMM) including a memory storage device and a post-package repair (PPR) module, the memory storage device arranged in a plurality of rows including data rows and redundant rows, the PPR module configured to remap an address within the DIMM physical address space from one of the data rows to one of the redundant rows; and
   a memory controller communicatively coupled to the DIMM and configured to determine an exact number of un-remapped redundant rows, to provide an indication that indicates that a number of un-remapped redundant rows is equal to zero when the indication is in a first state, that indicates that the number of un-remapped redundant rows is greater than or equal to one when the indication is in a second state, and that does not otherwise indicate the exact number of un-remapped redundant rows, and, in determining the exact number of un-remapped redundant rows, to:
   write a pre-determined data pattern to the data rows;
   select a first data row;
   direct the PPR module to remap the first data row to a first redundant row;
   read the first data row; and
   determine if the contents of the first data row include the pre-determined data pattern;
   wherein, when the contents of the first data row does not include the pre-determined data pattern, the memory controller is further configured to:
   write a first redundant row count pattern to the first data row; and
   increment a redundant row counter to indicate a first detection of a first un-remapped redundant row.

2. The information handling system of claim 1, wherein, in determining the exact number of un-remapped redundant rows, the memory controller is further configured to:
   select a second data row;
   direct the PPR module to remap the second data row to a second redundant row;
   read the second data row; and
   determine if the contents of the first data row include either the pre-determined data pattern or the first redundant row pattern.

3. The information handling system of claim 2, wherein, when the contents of the first data row does not include either the pre-determined data pattern or the first redundant row pattern, the memory controller is further configured to:
   write a second redundant row count pattern to the second data row, wherein the second redundant row pattern is different from the first redundant row pattern; and
   increment the redundant row counter to indicate a second detection of a second un-remapped redundant row.

4. The information handling system of claim 3, wherein, when the contents of the first data row include either the pre-determined data pattern or the first redundant row pattern, the memory controller is further configured to:
   determine the exact number of un-remapped redundant rows based upon the redundant row counter.

5. The information handling system of claim 1, wherein:
   the plurality of rows is organized into a first bank group of rows and a second bank group of rows, the first bank group of rows including first data rows and first redundant rows, and the second bank group of rows including second data rows and second redundant rows; and
   the memory controller is further configured to determine a first exact number of un-remapped first redundant rows, and a second exact number of un-remapped second redundant rows.

6. The information handling system of claim 1, wherein the information handling system is configured to direct the memory controller to determine the exact number of un-remapped redundant rows during a system boot process for the information handling system.

7. A method, comprising:
   coupling a dual in-line memory module (DIMM) of an information handling system to a memory controller of the information handling system, wherein the DIMM includes a memory storage device and a post-package repair (PPR) module, the memory storage device arranged in a plurality of rows including data rows and redundant rows, the PPR module configured to remap an address within the DIMM physical address space from a data row to a redundant row;

determining, by the memory controller, an exact number of un-remapped redundant rows;

providing, by the memory storage device, an indication that indicates that a number of un-remapped redundant rows is equal to zero when the indication is in a first state, that indicates that the number of un-remapped redundant rows is greater than or equal to one when the indication is in a second state, and that does not otherwise indicate the exact number of un-remapped redundant rows;

in determining the exact number of un-remapped redundant rows:

writing, by the memory controller, a pre-determined data pattern to the data rows;

selecting a first data row;

directing the PPR module to remap the first data row to a first redundant row;

reading the first data row; and determining if the contents of the first data row include the pre-determined data pattern; and when the contents of the first data row do not include the pre-determined data pattern:

writing, by the memory controller, a first redundant row count pattern to the first data row; and incrementing a redundant row counter to indicate a first detection of a first un-remapped redundant row.

8. The method of claim 7, wherein, in determining the exact number of un-remapped redundant rows, the method further comprises:

selecting, by the memory controller, a second data row;

directing the PPR module to remap the second data row to a second redundant row;

reading the second data row; and determining if the contents of the first data row include either the pre-determined data pattern or the first redundant row pattern.

9. The method of claim 8, wherein, when the contents of the first data row does not include either the pre-determined data pattern or the first redundant row pattern, the method futher comprises:

writing, by the memory controller, a second redundant row count pattern to the second data row, wherein the second redundant row pattern is different from the first redundant row pattern; and incrementing the redundant row counter to indicate a second detection of a second un-remapped redundant row.

10. The method of claim 9, wherein, when the contents of the first data row include either the pre-determined data pattern or the first redundant row pattern, the method further comprises:

determining, by the memory controller, the exact number of un-remapped redundant rows based upon the redundant row counter.

11. The method of claim 7, wherein the plurality of rows is organized into a first bank group of rows and a second bank group of rows, the first bank group of rows including first data rows and first redundant rows, and the second bank group of rows including second data rows and second redundant rows, the method further comprising;

determining, by the memory controller, a first exact number of un-remapped first redundant rows, and a second exact number of un-remapped second redundant rows.

12. The method of claim 7, further comprising:

directing, by the information handling system, the memory controller to determine the exact number of un-remapped redundant rows during a system boot process for the information handling system.

13. A memory controller, comprising:

a memory interface communicatively coupled to a dual in-line memory module (DIMM) including a memory having a plurality of data rows and a plurality of redundant rows, the DIMM further including a post-package repair (PPR) module configured to remap an address within the DIMM physical address space from one of the data rows to one of the redundant rows; and a redundant row detection module configured to determine an exact number of un-remapped redundant rows, wherein, in determining the exact number of un-remapped redundant rows, the redundant row detection module is further configured to:

direct the memory controller to write a pre-determined data pattern to the data rows;

select a first data row;

direct the PPR module to remap the first data row to a first redundant row;

direct the memory controller to read the first data row;

determine if the contents of the first data row include the pre-determined data pattern;

direct the memory controller to write a first redundant row count pattern to the first data row; and increment a redundant row counter to indicate a first detection of a first un-remapped redundant row.

* * * * *